United States Patent [19]

Simon

[11] Patent Number: 5,352,985
[45] Date of Patent: Oct. 4, 1994

[54] APPARATUS FOR DETERMINING THE RELATIVE POSITIONS OF POWER OUTLETS WITHIN AN ELECTRICAL CIRCUIT

[75] Inventor: Peter Simon, Darlinghurst, Australia

[73] Assignee: H.P.M. Industries PTY Limited, Australia

[21] Appl. No.: 982,515

[22] Filed: Nov. 27, 1992

[30] Foreign Application Priority Data

Nov. 29, 1991 [AU] Australia .................. PK9795

[51] Int. Cl.⁵ .................................. G01R 27/02
[52] U.S. Cl. ............................ 324/716; 324/525; 345/214
[58] Field of Search ............. 324/526, 525, 699, 716, 324/718, 522

[56] References Cited

U.S. PATENT DOCUMENTS

| | | | |
|---|---|---|---|
| 3,281,673 | 10/1966 | Richardson | 324/525 |
| 4,144,487 | 3/1979 | Pharney | 324/522 |
| 4,797,604 | 1/1989 | Rocci | 324/716 |
| 4,906,938 | 3/1990 | Konopka | 324/66 |

Primary Examiner—Kenneth A. Wieder
Assistant Examiner—Jose M. Solis
Attorney, Agent, or Firm—Hayes, Soloway, Hennessey, Grossman & Hage

[57] ABSTRACT

An apparatus for determining the relative positions of power outlets within a multi-outlet electrical circuit and, specifically, for determining the first occurring power outlet in a multiple-earth-neutral power system in which earth and neutral wires are interconnected at a distribution point. The apparatus incorporates circuitry for generating a current pulse and probe means for injecting the pulse into a wiring loop which extends between neutral and earth contact terminals of each of the power outlets. The probes are also employed for detecting the voltage drop which occurs along the wiring loop as a consequence of the current flow through the loop, and circuitry is provided for generating a signal which is representative of the voltage drop along the wiring loop. A liquid crystal display device which is driven by an analogue-to-digital converter is employed for generating and displaying an output which is representative of the level of the signal which is itself representative of the voltage drop along the wiring loop. The current pulse itself is generated in a manner such that it ramps up and ramps down at the leading and trailing ends of the pulse and the display provided by the indicator device is inhibited during the ramping period of the current pulse.

3 Claims, 2 Drawing Sheets

APPARATUS FOR DETERMINING THE RELATIVE POSITIONS OF POWER OUTLETS WITHIN AN ELECTRICAL CIRCUIT

Field of the Invention

This invention relates to an apparatus for use in determining the relative positions of power outlets within a multi-outlet electrical circuit. The invention has been developed primarily for use in locating a power outlet that first occurs in an electrical circuit after a main distribution panel and the invention is hereinafter described in such context.

Background of the Invention

Circumstances exist in which electrical apparatus should be located at particular positions within electrical circuits and it is difficult frequently to locate those positions in pre-existing wiring, especially when the wiring is sealed within wall cavities or in inaccessible roofs. For example, when providing protection for an existing circuit with an earth leakage circuit-breaker it is normally necessary that the circuit-breaker be installed in the position of the first occurring power outlet in a power circuit, in order that the earth leakage protection will be provided for all downstream power outlets.

It might be assumed by the uninitiated that the power outlet which is located physically closest to the main distribution panel will be the first occurring outlet in a circuit, but this need not be the case. When installing wiring, electricians and wiring contractors frequently locate the first power outlet at a position which is remote from the distribution panel, and it should never be assumed that the position of an outlet within a circuit corresponds with the physical placement of the outlet. As a consequence, the task of locating the first occurring power outlet in a particular circuit can be difficult and time-consuming.

Summary of the Invention

The present invention seeks to obviate this problem by providing an apparatus for determining the relative lengths of wiring within an electrical circuit and, thus, the relative positions of power outlets that are joined by the wiring. The wiring lengths are determined by reference to voltage drops along the wiring and, thus, by reference to the electrical resistance, including contact resistance, within the circuit.

Thus, the invention may be defined broadly as providing an apparatus for determining the relative positions of power outlets within a multi-outlet electrical circuit and which comprises means for generating a current pulse and probe means for injecting the pulse into a wiring loop which extends between neutral and earth contact terminals of each of the outlets. The probe means are employed also for detecting within the period of the current pulse the voltage drop which occurs along the wiring loop as a consequence of the current flow through the loop, and the apparatus includes means for generating a signal which is representative of the voltage drop along the wiring loop. An indicator device to which the signal is applied is provided for generating an output which is representative of the level of the signal and, hence, of the length of wiring between each outlet and a junction of the neutral and earth wiring in the electrical circuit.

Features of the Invention

The indicator device may function to provide a visual and/or audible output when the lower or lowest of two or more voltage drops is measured and, in such case, the indicator device may comprise a light emitting device or a buzzer which is activated when the first and any subsequent lower level signal is generated. In an alternative form of the apparatus, the indicator device may comprise an analogue or a digital display device which functions to provide a display of the level of the signal which is representative of the voltage drop.

The apparatus as above defined has application in an electrical installation which employs a multiple earth-neutral (MEN) link in a distribution panel. By measuring the electrical resistance of the loop between the neutral and earth terminals of contact sockets of a power outlet, a measure is obtained of distance that the power outlet is located from the distribution panel. The measure of resistance is obtained as a measure of the voltage drop along the loop. Having obtained such a measure of the voltage drop along the loop associated with one power outlet, similar measurements may be obtained in respect of the or each other power outlet in the same circuit. Thus, readings are obtained in respect of the relative distances of the power outlets from the distribution panel, the distances being related to the length of wiring rather than to the physical placement of the power outlets.

The invention will be more fully understood from the following description of a preferred embodiment of an apparatus which is arranged to provide a visual display of the position of a power outlet in a multi-outlet circuit in terms of the voltage drop along a wire loop between the outlet and a distribution board. The description is provided with reference to the accompanying drawings.

DETAILED DESCRIPTION OF THE INVENTION

Figure 1:
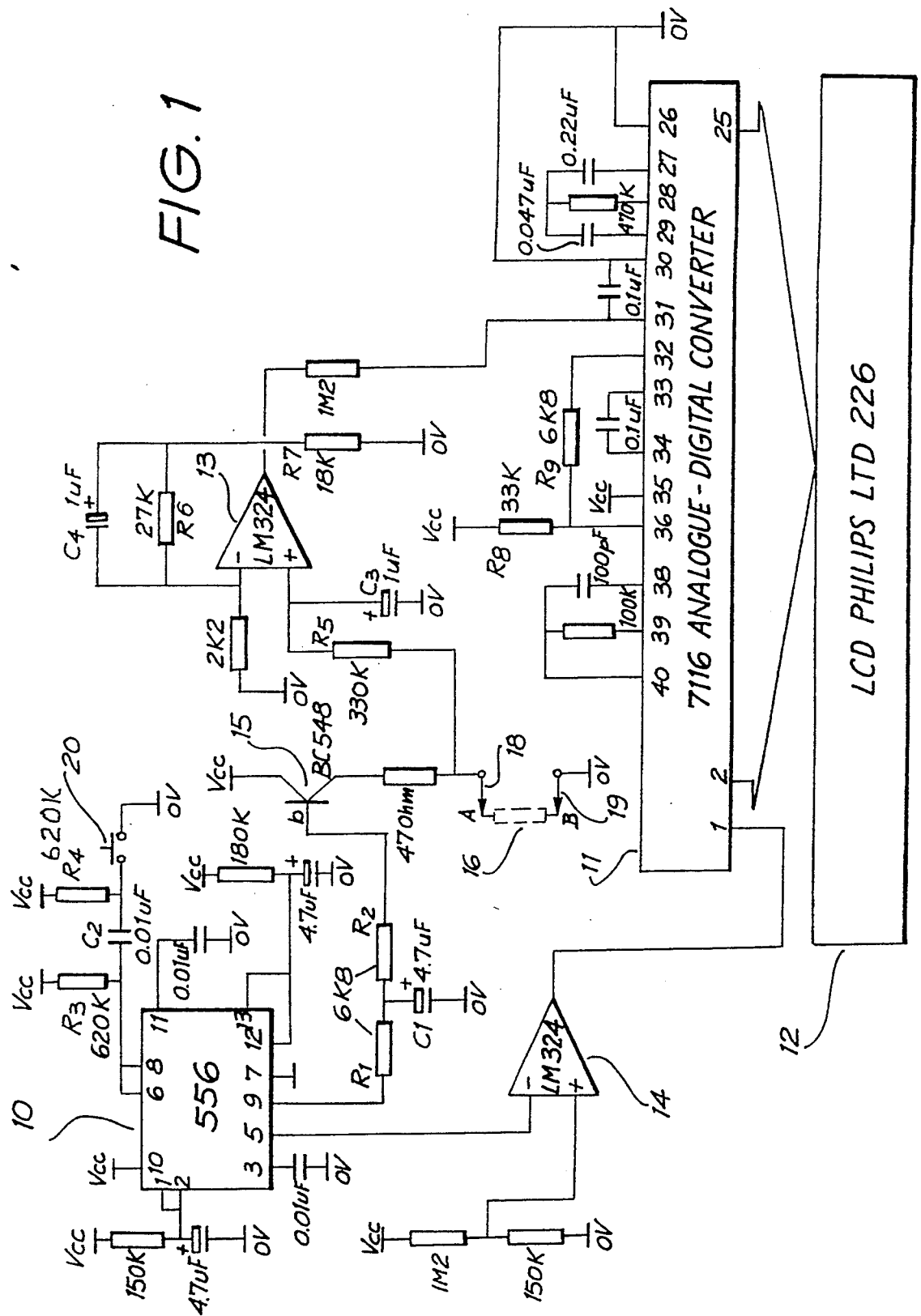
FIG. 1 shows a circuit diagram of a major part of the apparatus.

As illustrated in FIG. 1, the circuit includes a low power CMOS dual monostable timer 10 (international code no. 556) which provides a first pulse output from pin 5 following activation of the timer. The output pulse is employed to generate a data hold signal for an analogue-to-digital (A-D) converter 11. The A-D converter drives a liquid crystal display 12 which provides a visual display of the voltage level of an output voltage signal from an operational amplifier 13.

The A-D converter 11 provides for holding of the display when the data hold signal goes from high to low and, thus, the output from the timer 10 is fed to the A-D converter 11 by way of an invertor 14.

A second output, in the form of a one-second duration pulse, is derived from pin no. 5 of the timer 10 and, following shaping as below mentioned, is applied to the base of a transistor 15. When turned on by the applied pulse, the transistor 15 passes a one-second current pulse of approximately one hundred milliamps into the earth-neutral wiring loop 16 associated with a selected power outlet socket 17 which is shown in dotted outline in FIG. 2. Probes 18 and 19 are provided for this purpose.

An RC network consisting of resistors R1, R2 and capacitor C1, is provided to cause the base signal to the transistor 15 to ramp up and ramp down, so that the (correspondingly shaped) current pulse through the collector-emitter circuit of the transistor 15 will not produce unintended tripping of any earth leakage circuit breakers in the wiring loop 17.

The first stage of the timer 10 is controlled such that the output pulse from pin no. 5 is delayed slightly relative to the output pulse from pin no. 9 and such that the duration of the first output pulse is shorter than that of the second output pulse, in order to prevent any display of the output voltage level during the time when the current pulse from the transistor 15 is ramping up or ramping down.

A switch circuit consisting of a normally open switch 20 and an RC network (containing resistors R3, R4 and capacitor C2) is provided to generate activating inputs to the dual output timer 10.

The voltage drop that occurs along the wiring loop 16 as a consequence of current flow through the loop is applied to the non-inverting input of the operational amplifier 13. This voltage, which will be dependent on wiring and contact resistance within the loop 16, is amplified and applied to the A-D converter 11. A numerical value of the level of the output signal from the amplifier 13 is thus displayed by the display device 12. The voltage applied to the input of the operational amplifier 13 might typically be in the order of 50 mV to 500 mV.

A filter network, consisting of resistor R5 and capacitor C3, is provided for filtering any ac that may be present in the wiring loop 17, so that input to the operational amplifier 13 is substantially pure dc. Resistor R6 and capacitor C4 in the feedback network of the operational amplifier 13 are provided to set the gain of the amplifier and, effectively, to cancel any ac voltage that may be present at the non-inverting input to the operational amplifier. Resistor R7 provides a load resistance for the operational amplifier 13.

Resistors R8 and R9 provide a voltage divider/high level reference for the reference voltage to the A-D converter. The reference voltage itself determines the "full scale deflection" of the converter.

Other circuit components that are shown in the diagram of FIG. 1 but not specifically mentioned above are employed for loading or controlling the various integrated circuits and, given that their function will be well understood by those familiar with electronic circuits, the functions of the individual components are not specifically detailed. Those components that are associated with the A-D converter provide for internal timing of the converter and the listing on the following page indicates the A-D converter to LCD connections.

| 7116 | LCD |
|---|---|
| 1 | Data Hold |
| 2 | 18 |
| 3 | 19 |
| 4 | 20 |
| 5 | 21 |
| 6 | 22 |
| 7 | 23 |
| 8 | 17 |
| 9 | 14 |
| 10 | 15 |
| 11 | 24 |
| 12 | 25 |
| 13 | 26 |
| 14 | 13 |
| 15 | 10 |
| 16 | 29 |
| 17 | 31 |
| 18 | 9 |
| 19 | 34-7 |
| 20 | 2 |
| 21 | 1 |
| 22 | 32 |
| 23 | 30 |
| 24 | 11 |
| 25 | 27 |
| 37 | N C |

Figure 2:
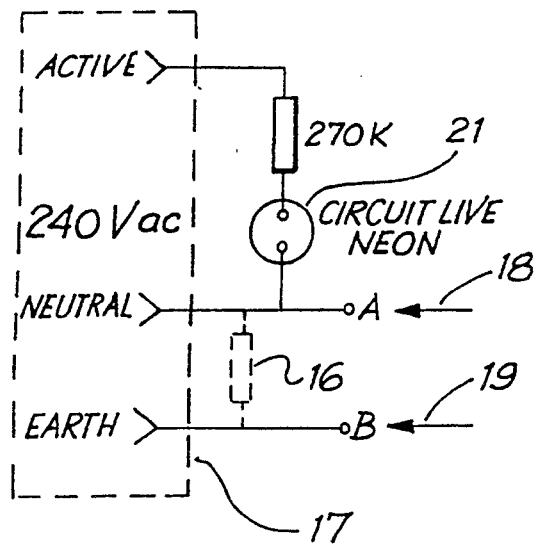
FIG. 2 shows a diagram of an associated circuit in the form of a mains voltage indicator.

When using the apparatus to determine the position of a given power outlet socket in a mains circuit, the supply voltage to that power outlet should be turned off to minimise the amount of mains frequency noise at the input to the D-A converter. FIG. 2 shows a circuit which may be incorporated in the above described apparatus for the purpose of determining whether power is or is not connected to a power outlet socket 17. This comprising a neon indicator lamp 21 which is connected across the active to neutral contact terminals of the socket prior to connecting the probes 18 and 19 to the neutral and earth sockets.

Figure 3:
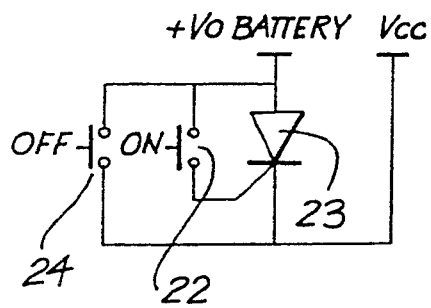
FIG. 3 shows a diagram of an associated circuit for connecting power from a battery to the circuit of FIG. 1.

FIG. 3 of the drawings shows a circuit that may be employed in the above described apparatus for switching on the positive supply voltage $V_{cc}$ from a nine volt battery (not shown). The circuit includes an ON switch 22 which when closed causes current to flow into the gate of the SCR 23, turning it on and establishing supply voltage. When the OFF switch 24 is closed, approximately one-half of the load current flows through the OFF switch, this reducing the current flow through the anode-cathode of the SCR and causing the SCR to turn-off when the full current of the SCR is less than its required holding current.

Figure 4:
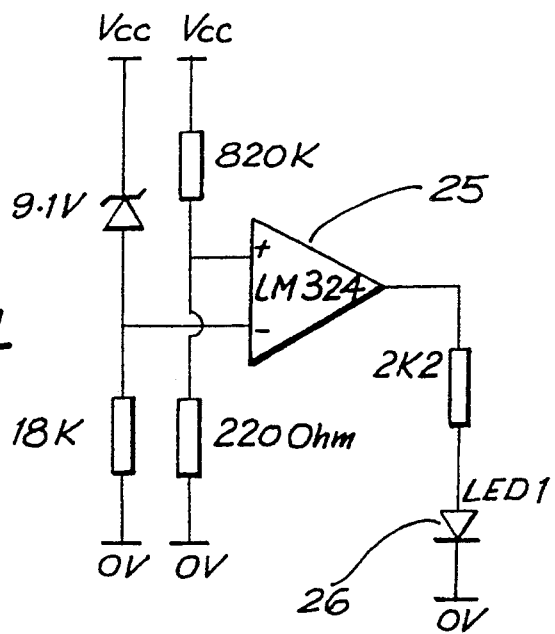
FIG. 4 shows a diagram of a low battery voltage indicator circuit for use in conjunction with the circuit of FIG. 1.

A low battery level indicator circuit as shown in FIG. 4 may be incorporated in the apparatus as illustrated in FIG. 1. The circuit provides a warning when the battery voltage level falls below a predetermined level and indication is thereby given that the battery should be replaced.

As illustrated, the battery voltage level indicator circuit monitors the supply voltage $V_{cc}$ by means of a zener diode. If the supply voltage falls below the operating voltage of the zener diode, the current passing through the diode drops and this in turn causes a decrease in the voltage on the negative input to an operational amplifier 25. If the voltage applied to the inverting input of the operational amplifier drops below the reference voltage on the non-inverting input, the operational amplifier will be caused to go into positive saturation, its output will go high and the light emitting diode 26 in circuit with the output of the operational amplifier will be illuminated.

Whilst circuit component type numbers and values are indicated in the accompanying drawings, it will be understood that these have been provided for illustrative purposes only, and that the indicated circuit values may be substituted to accommodate alternative circuit components.

I claim:

1. An apparatus for determining relative positions of power outlets within a multi-outlet electrical circuit in which earth and neutral wires are interconnected, the apparatus comprising: means for generating a periodic current pulse, probe means for injecting the current pulse into a wiring loop which extends between neutral and earth contact terminals of each of the outlets and for sensing voltage across the contact terminals, means for detecting within the period of the current pulse a voltage drop which occurs along the wiring loop as a consequence of current flow through the loop, means for generating a signal which is representative of the voltage drop along the wiring loop, and an indicator device to which the signal representative of the voltage drop is applied for generating an output display which is representative of level of the signal and of length of wiring between each outlet and a junction of the neutral and earth wiring in the electrical circuit, wherein: the means for generating the current pulse includes a ramping circuit for causing the pulse to ramp up and ramp down at leading and trailing ends respectively of the pulse, said apparatus further comprising means for generating an enabling signal for application to the indicator device to inhibit said output display during ramping of said current pulse, and the enabling signal comprises a timing pulse which has a duration shorter than that of the current pulse by an amount at least equal to duration of ramping of the current pulse.

2. The apparatus as claimed in claim 1 wherein the indicator device comprises a numerical display device.

3. The apparatus as claimed in claim 1 and further including a voltage-presence indicator circuit which is connectable in use of the apparatus across the neutral and active contact terminals of each outlet.

* * * * *